Figure 1:
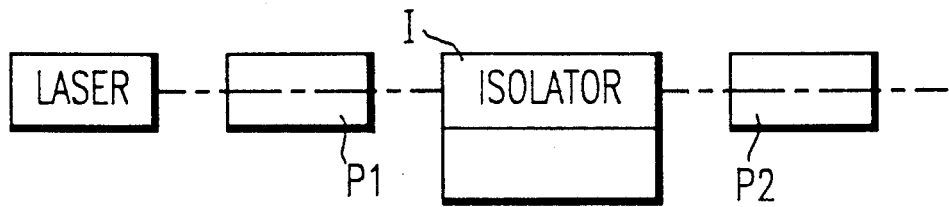

United States Patent [19]

Castera et al.

[11] Patent Number: 5,015,051
[45] Date of Patent: May 14, 1991

[54] INTEGRATED SINGLE-MODE ISOLATOR WAVEGUIDE AND APPLICATION TO A SEMICONDUCTOR LASER

[75] Inventors: Jean-Paul Castera, Orsay; Paul-Louis Meunier, Paris; Alain Carenco, Fontenay-Aux-Roses; Jean-Marie Dupont, Les Ulis; Pierre Friez, Paris, all of France

[73] Assignees: Thomson-CSF, Paris; Etat Francais, Issy Les Moulineaux, both of France

[21] Appl. No.: 301,890

[22] PCT Filed: Apr. 5, 1988

[86] PCT No.: PCT/FR88/00166
§ 371 Date: Dec. 7, 1988
§ 102(e) Date: Dec. 7, 1988

[87] PCT Pub. No.: WO88/08148
PCT Pub. Date: Oct. 20, 1988

[30] Foreign Application Priority Data

Apr. 7, 1987 [FR] France .................... 87 04890

[51] Int. Cl.$^5$ .................................. G02B 6/10
[52] U.S. Cl. ........................ 350/96.12; 350/96.11; 350/96.13; 350/96.14
[58] Field of Search .............. 350/96.11, 96.12, 96.13, 350/96.14, 400, 403, 406

[56] References Cited

U.S. PATENT DOCUMENTS

| | | | |
|---|---|---|---|
| 4,575,179 | 3/1986 | Lee et al. | 350/96.13 |
| 4,671,721 | 6/1987 | Dillon, Jr. et al. | 350/403 |
| 4,859,014 | 8/1989 | Schmitt et al. | 350/96.13 |

OTHER PUBLICATIONS

Revue Techniques Thomson-CSF, vol. 18, No. 2, Jun. 1986, Gauthier-Villars J.-P. Castera et al, pp. 255-300.
Applied Optics, vol. 25, No. 12, Jun. 15, 1986, S. Matsumoto et al, pp. 1940-1945.
Optical and Quantum Electronics, vol. 10, No. 5, Sep. 5, 1978, Chapman and Hall Ltd. (GB), pp. 393-398.
Conference Europeenne sur les Communications Optiques, Sep. 21-24, 1982, R. C. Booth et al, pp. 238-243.
Journal of Lightwave Technology, vol. LT-2, No. 2, Apr. 1984, IEEE (New York, U.S.), S. Hava et al, pp. 175-180.
Electronics Letters, vol. 20, No. 25/26, Dec. 6, 1984, (Stevenage, Herts, GB), R. C. Booth et al, pp. 1045-1047.

Primary Examiner—Frank Gonzalez
Attorney, Agent, or Firm—Oblon, Spivak, McClelland, Maier & Neustadt

[57] ABSTRACT

Integrated single-mode isolator waveguide having a heating means (3) making it possible to increase the efficiency of the isolator (1). The invention also provides for an intermediate layer (5) located between the guide layer (1) and the substrate (2). Application: coupling of laser diodes to operation circuits.

11 Claims, 3 Drawing Sheets

INTEGRATED SINGLE-MODE ISOLATOR WAVEGUIDE AND APPLICATION TO A SEMICONDUCTOR LASER

The invention concerns an integrated single-mode isolator and, particularly, a guiding device enabling a laser diode to be coupled with optical circuits, while at the same time efficiently preventing the return of light energy towards the laser diode.

As an example, to illustrate the state of the art, FIG. 1 shows a drawing of an isolator and its working. This device consists of a non-reciprocal section I and two accurately oriented polarizers P1, P2. In the non-reciprocal section I, formed by a YIG section, the incident light polarizing plane rotates by 45° by Faraday effect. Any reflected light will have, after a second passage through this section, a polarization crossed with the input polarizer. The isolation effect is then obtained.

Figure 2:
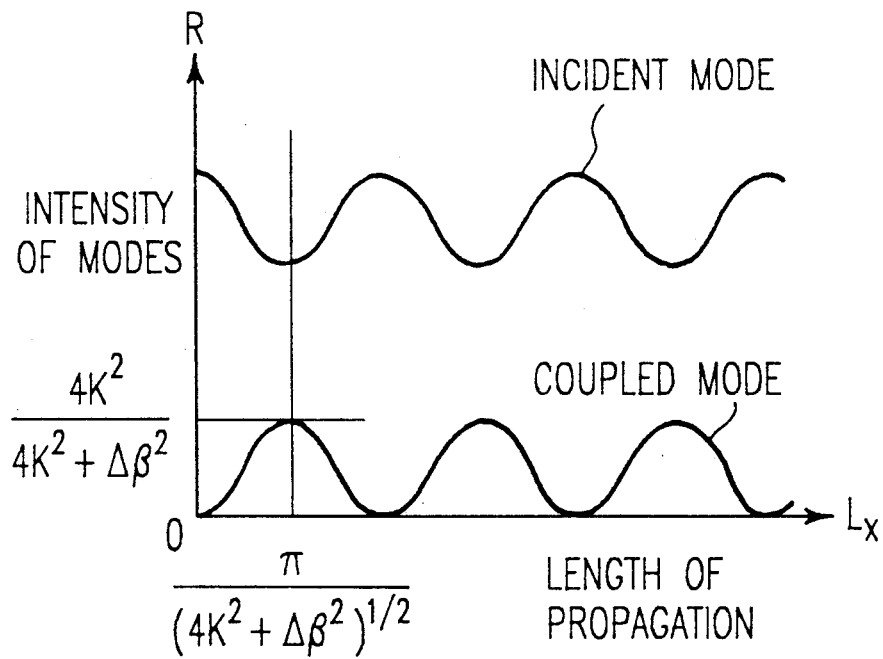

In integrated optics, light is propagated in a thin layer of yttrium-iron-garnet doped, for example, with gadolinium and gallium ions, in the form of type TE and TM (plane guide) or E and H (two-dimensional guide) inherent modes. The Faraday effect couples the TE and TM or E and H modes. Thus for a single-mode plane guide, assuming that the incident wave at the input of the guide has a polarization parallel to the mode TEo, the intensity R, converted non-reciprocally into TMo at a point located at a distance Lx from the input of the guide, will have the following expression:

$$R = \frac{I_{TMo}(L)}{I_{TEo}(o)} = \frac{4K^2}{4K^2 + \Delta\beta^2} \sin^2\left[\frac{1}{2} \sqrt{4K^2 + \Delta\beta^2}\, L\right] \quad (1)$$

Where K is the Faraday constant:

$$\Delta\beta = \frac{2\pi}{\lambda} \Delta N \text{ with } \Delta N = N_{TEo} - N_{TMo}, N_{TEo} \text{ And } N_{TMo}$$

being respectively the effective indices of the TEo and TMo modes. FIG. 2 represents the variation of R as a function of L. The relationship (1) shows that, for K constant, the conversion is complete (R=1) only if $\Delta\beta = 0$. In this case, the modes are degenerated and a total conversion is obtained for a distance of propagation $Z_o$ such that $$Z_o = \frac{\pi}{2k}.$$

For $\Delta\beta \neq 0$, the maximum conversion rate $R_M$ is given by (1) satisfies:

$$R_M = \frac{4K^2}{4K^2 + \Delta\beta^2} \quad (2)$$

Thus, for a layer of yttrium-iron-garnet (YIG) substituted by gadolinium and gallium ions, of a thickness of 3 µm, the refractive index n≃ to 2.15 and the Faraday rotation K=206°/cm at λ=1.15 µm, $\Delta\beta$=1633°/cm, giving $R_M$≃1.6%.

By analogy with non-guided optics, an integrated optical isolator uses a non-reciprocal section with a length corresponding to a conversion of 50% in the OUTGOING direction and 50% in the RETURN direction. This section is completed by a polarizer at the input and a polarizer at the output. A single polarizer may suffice. This is the case, for example, with semiconductor lasers which it is desired to shield from stray reflections. For, it has been shown that these sources are practically insensitive to stray reflections having polarization which is perpendicular to their own polarization. In this case, an integrated version of the isolator, formed by a metallic layer which is separated from the garnet by a dielectric, may be envisaged. The drawback in this case comes from the non-coincidence between the planes of the laser and of the garnet.

But in all cases, the isolator, in integrated optics, necessitates a total conversion between the two coupled modes after a to-and-fro movement in the non-reciprocal section. It is therefore imperative to cancel $\Delta\beta$, therefore $\Delta N$.

Different solutions have been envisaged to resolve this problem. The article, *Effets magnétooptiques dans les grenats et leur application à la réalisation d'un isolator et d'un circulator optique* (Magneto-optical Effects in Garnets and their Application to the Making of an Isolator and an Optic Circulator", by J. P. CASTERA et al. published in the "Revue Technique THOMSON CSF", Vol. 18, No. 2., June 1986, pp. 255 to 300, describes these different solutions. Two types of solutions were envisaged:

A modulation of the magneto-optical interaction, hence of the coupling constant of the transmission modes as described, for example, in:

the article by P. K. TIEN et al. published in "Applied Physic (sic) Letters", Vol. 21, 1972, page 394;

the article by R. D. HENRY published in "Applied Physic (sic) Letters", Vol. 26, 1975, page 408;

An equalization of the constants of propagation of the two coupled modes, as described in:

the article by J. HEPNER et al. published in "Applied Optic (sic)", Vol. 13, 1974, page 2007.

the article by J. HEPNER et al. published in "Applied Optic (sic)", Vol. 14, 1975, page 1479.

However, all the methods that have just been described are not entirely satisfactory for, while they enable considerable reduction in Δ, their precision, on the other hand, makes perfect phase matching between the coupled modes impossible.

It is thus, for example, that to obtain perfect isolation, there should be R=1, hence $\Delta\beta = \Delta N = 0$ in the expression (2). Any variation in the difference between the lattice parameters of the layer and of the substrate with respect to this ideal situation will result in a variation in isolation. The following table gives, for several values of $\Delta a = a_f^l - a_s$, the corresponding birefringence $\Delta n_e$ and the isolation performances of the device,:

| Δa (Å) | Δn$_{ep}$ | I (dB) |
|---|---|---|
| 2,4 10$^{-5}$ | 8,6 10$^{-7}$ | 40 |
| 7,5 10$^{-5}$ | 2,7 10$^{-6}$ | 30 |
| 2,4 10$^{-4}$ | 8,7 10$^{-6}$ | 20 |
| 8,1 10$^{-4}$ | 2,9 10$^{-5}$ | 10 |

Now, the uncertainty on the relative lattice parameter difference, enabled by the process of liquid phase epitaxy of Gd Ga YIG garnets, is at best: $\delta a/a = 10^{-5}$, that is, $\delta a = 6.2 \, 10^{-4}$Å. The above table shows that, under these conditions, an isolator thus designed will present an isolation rate of the order of 10 dB, which is markedly insufficient for the applications. Besides, our computation assumes that all the other parameters that play a part in the conversion rate are perfectly controlled, which is not always the case. Among these magnitudes, it is possible to cite: the thickness of the epitaxially grown thin layer or layers, the respective index of these deposits as well as the length of the guide. This (can be done) for the plane guides. In the case of two-dimensional guides, it is necessary to add, to these parameters, the depth of the partial ionic machining as well as the shape of the section of these guides.

It appears therefore that the requirements imposed on the epitaxy of garnets for the making of an isolator having, for example, 50 dB of isolation, are not applicable in practice, even in assuming ideal conditions of growth of the materials. However, the control of the epitaxy of ferrimagnetic garnets is remarkable compared with the preparation of materials in other fields. The solution should therefore make use an adjustable parameter p, generating a birefringence, and such that $(\Delta n/\Delta f)$ is high enough to obtain the phase matching of both coupled modes and small enough for the precision on p to enable the maintaining of a high isolation rate in all circumstances.

The invention therefore provides a solution to this problem, by acting on the temperature of the guide, this "temperature" parameter having, according to the invention, an effect on the birefringence.

The invention therefore concerns an integrated, single-mode isolator waveguide, comprising a guide layer implanted in a substrate with a refraction index greater than that of the substrate, having an input and an output, at least one polarizing device placed at the input of the guide layer and oriented so as to eliminate a polarization mode of an entering beam, after return into the waveguide from the output, characterized in that it comprises at least one heating means associated with the guide layer.

Figure 3:
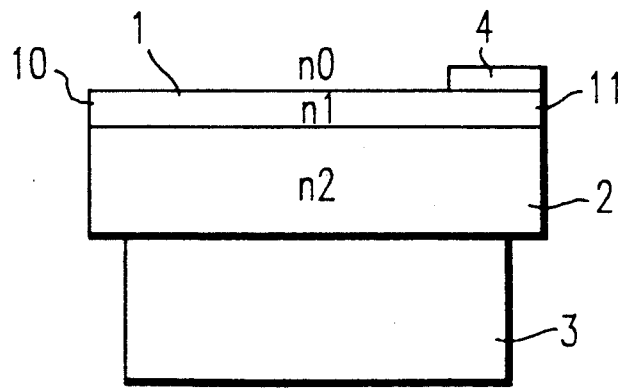
Figure 4:
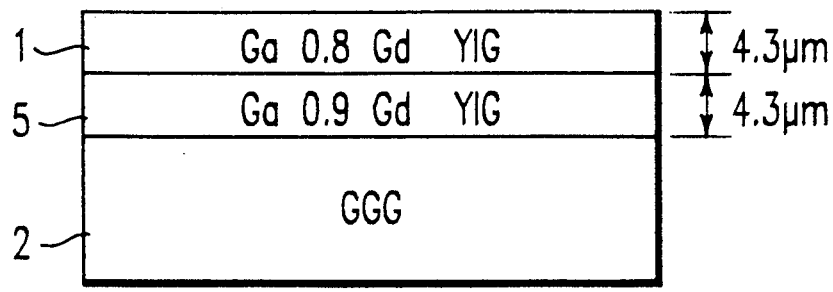
Figure 5:
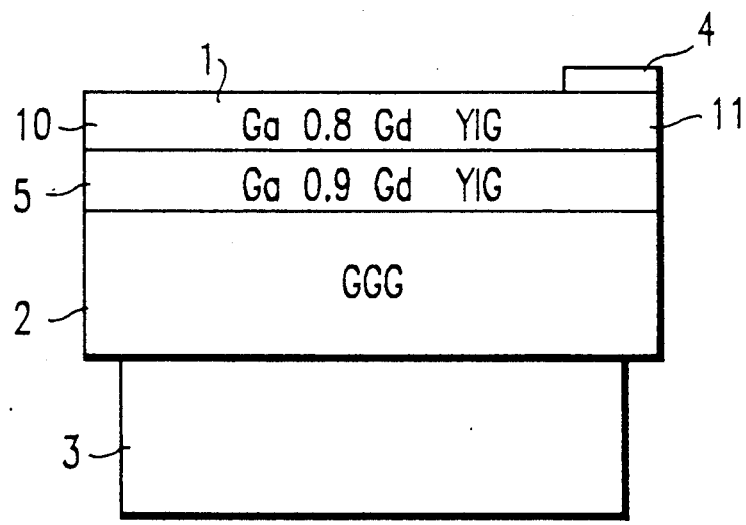
Figure 6:
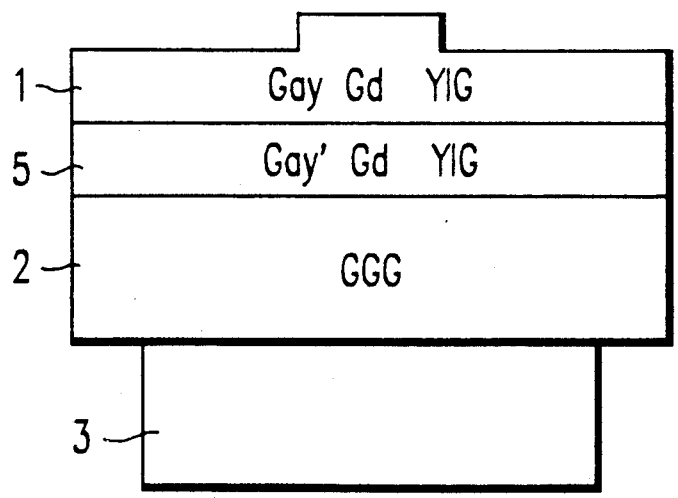
Figure 7:
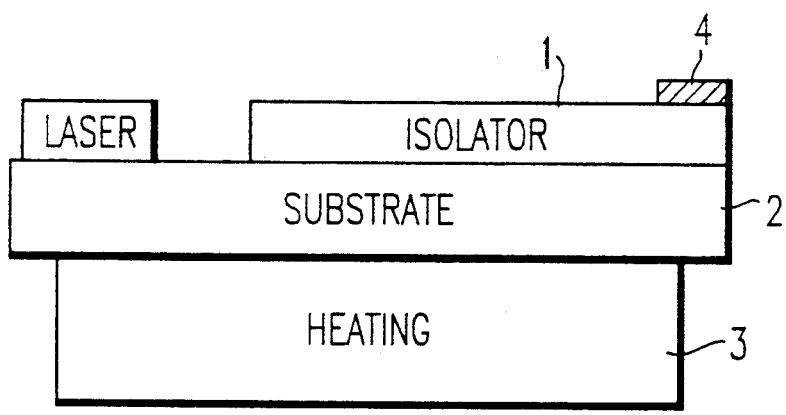

The various objects and features of the invention will appear more clearly in the description that will follow, made by way of example, in referring to the appended figures which represent:

FIG. 1, a waveguide according to the prior art techniques;

FIG. 2, a curve of operation of the guide of FIG. 1;

FIG. 3, an embodiment of a monolayer plane guide according to the invention;

FIG. 4, an embodiment of a two-layer plane guide according to the invention;

FIG. 5, an alternative embodiment of a two-layer plane guide according to the invention;

FIG. 6, an embodiment of a two-dimensional and two-layer guide according to the invention;

FIG. 7, an embodiment of a laser diode and an integrated isolator, associated according to the invention.

As described above, in referring particularly to the guide as shown in FIG. 1, the structure of a guide causes a birefringence $\Delta N_{ST}$ between the coupled modes. The present invention has the object of compensating for this phase difference between modes by a birefringence $\Delta N_T$ of opposite sign and equal amplitude, due to a raising of the temperature.

If it is assumed that, in addition to these birefrigences, it is also possible to have a term $\Delta N_{EP}$, generated by the difference between the lattice parameters of the layer and of the substrate and, possibly, a term $\Delta N_{CR}$ which is due to growth, the total birefringence has the following expression:

$$\Delta N = \Delta N_{ST} + \Delta N_{TE} + \Delta N_{EP} + \Delta N_{CR}$$

$\Delta N_{CR}$ can be cancelled by an annealing operation. If not, it should be taken into account in the computations. $\Delta N_{ST}$ verifies the relationship:

$$\Delta N_{ST} = N_{TEo} - N_{TMo}$$

where $N_{TEo}$ and $N_{TMo}$ are the effective indices of the inherent coupled modes of the guide.

$\Delta N_{EP}$ is given by the reaction:

$$\Delta N_{EP} = N_o^3 \, p44 \, \frac{a_f^{\perp} - a_s}{a_s}$$

wherein p44 is a photoelastic coefficient proper to the material of the guide.

As for $\Delta N_{TE}$, it satisfies the equation:

$$\Delta N_{TE} = -N_o^3 \, p44 \, \frac{1+\nu}{1-\nu} (\alpha_f - \alpha_s) \Delta T$$

where $\nu$ is Poisson's ratio ($\nu=0.3$), $\alpha_f$ and $\alpha_s$ are the heat expansion coefficients, respectively, of the layer and the substrate and $T = T - T_o$, T is the temperature to which the garnet is heated and $T_o$ is the ambient temperature.

To obtain perfect isolation, there should be $\Delta N = 0$. The invention therefore provides for heating the garnet to a temperature T such that:

$$T = T_o + \frac{1}{N_o^3 \, p44} \, \frac{1-\nu}{1+\nu} \, \frac{1}{\alpha_f - \alpha_s} (\Delta N_{ST} + \Delta N_{EP} + \Delta N_{CR})$$

$(\alpha_p - \alpha_s)$ depends on the garnets used.
Typically, we get:

$$\alpha_f - \alpha_s < 0.3 \cdot 10^{-5} \text{ degrees}^{-1}.$$

According to the invention, there is thus provision, as shown in FIG. 3, for a monolayer plane guide provided with a heating means.

In this figure, there is seen a substrate 2 bearing a guide layer 1 with a heating means 3. According to this embodiment, the heating means is a Peltier effect device arranged so as to heat the guide layer 1. The waveguide 1 has an input 10 and an output 11. With the output 11, there is associated a polarizer 4. This polarizer 4 can be made in the form of a metallization located above the output of the guide.

According to the embodiment shown in FIG. 3, the substrate 2 is associated thermally, by bonding for example, with a Peltier effect device 3.

For example, the guide layer can be made of yttrium-iron-garnet (YIG) substituted by gadolinium and gallium and obtained by liquid phase epitaxy on a gadolinium-gallium-garnet (GGG).

The heating provided by the heating device 3 enables the creation of a birefringence which enables improving the efficiency of the isolator thus made.

According to the invention, there is also provided a structure as shown in FIG. 4, with provision for an intermediate guide layer 5, placed between the guide layer 1 and the substrate 2.

This is a layer, made for example by epitaxy, showing a slightly lower index, which will serve as a new substrate. The difference in the refraction index between this layer 5 and the guide layer 1 is small ($\simeq 5.10^{-3}$) for, it is desired to have a single-mode guide of a thickness compatible with the diameter of the core of the single-mode fibers. This layer is got by slightly modifying the gallium doping. In this case, $\Delta N_{ST}$ is far smaller. Thus, let us consider the example shown in FIG. 4.

The indices at $\lambda = 1.15$ μm and $\lambda = 1.52$ μm verify:

| λ (μm) | 1,15 | 1,52 |
|---|---|---|
| Ga$_{0.8}$Gd YIG | 2,157 | 2,160 |
| Ga$_{0.9}$Gd YIG | 2,148 | 2,151 |

The guide (Ga$_{0.8}$ Gd YIG) is a single-mode guide and $\Delta N_{ST}$ satisfies:

| λ (μm) | 1,15 | 1,52 |
|---|---|---|
| $\Delta N_{ST}$ | 8,3 $10^{-5}$ | 15 $10^{-5}$ |

These values are considerably lower than for the monolayer plane guide.

The measurement of $\Delta N_{TE}(T)$ on this type of composition gives, (in) a first approximation, a straight line with a slope:

$$a = -0.25 \ 10^{-5}/°C.$$

There is deducted, therefrom, the temperature difference to be applied to the garnet, in order to have total conversion.

| λ (μm) | 1,15 | 1,52 |
|---|---|---|
| $\Delta T$ (°C.) | 33,2 | 60 |

The invention therefore provides, as shown in FIG. 5, for a heating device 3 associated with a guide such as the one that has just been described.

The heating is effected by means of a regulated Peltier effect device.

The temperatures needed for phase matching are compatible with the electronic devices (indeed, it is generally desirable, if the temperature has to be regulated, to work at a temperature greater than the ambient temperature). Besides, this point of operation can be changed by adding an epitaxial birefringence (slight modification of the composition).

The computation just made assumes $\Delta N_{EP} = 0$, which is practically the case for Ga$_{0.8}$ Gd YIG. A more exact computation shows that there is a slight lattice mismatching.

$\Delta a = a_f - a_s = 8.10^{-4}$ Å which leads to:

$\Delta N_{EP} = +2.8 \ 10^{-5}$.

A structure of this type has been subjected to experiment. The measurements of $\Delta N$ at ambient temperature have shown that there is a residual birefringence, probably of growth, $\Delta N_{CR} = 4.10^{-5}$. At ambient temperature, $\Delta N = 16.5 \ 10^{-5}$ and a total conversion (99.4% measured), that is $\Delta N \simeq 0$, has been obtained for a heating of $\Delta T = 65°$ C., a value which matches the preceding results very well.

To change the operating temperature, it would be necessary to slightly alter the composition of the guide layer 1, but also that of the intermediate layer 5, so that the light is propagated always in a guide layer 1. Thus, to reduce the operating temperature, $\Delta N_{ST}$ will be compensated for by $\Delta N_{EP}$ by increasing the gallium substitution. With a structure Ga$_{1.0}$ Gd YIG/Ga$_{1.1}$ Gd YIG/GGG, assuming that there is no birefringence of growth at all, the rise in temperature would not be greater than $\Delta T = 3.5°$ C.

The temperature enables the cancellation of $\Delta N$, and the obtaining of a high isolation rate I but, on the other hand, any variation of T will be accompanied by a deterioration in the performance characteristics of the device. The following table gives the maximum temperature differences that must be respected in order to preserve a given isolation rate:

| I dB | $\Delta T$ (°C.) |
|---|---|
| 40 | 0,34 |
| 30 | 1,08 |
| 20 | 3,48 |
| 10 | 11.60 |

The invention is applicable to a two-dimensional guide.

The section of a guide of this type is shown in FIG. 6.

These guides are obtained by partial machining of the upper layer. Compared with the two-layer plane guide, the machining of the 2D guide has the effect of bringing the variation curves of the inherent modes of the guide closer to one another and, hence, of reducing $\Delta N_{ST}$. This will have the effect of reducing $\Delta T$ and, hence, of reducing the operating temperature.

To stabilize the operating temperature efficiently, the invention provides for associating a Peltier effect device with the guide. As shown in FIG. 6, a Peltier effect device 3 is placed beneath the substrate 1 of the guide.

These Peltier effect devices are now compact and simple to use, and are used in numerous applications (for example to stabilize semiconductor lasers).

According to the invention, there is also provision, in one embodiment, as shown in FIG. 7, in which an isolator waveguide is placed near a semiconductor laser 8 to conduct the light that it emits, to make the laser 7 and the isolator waveguide 1 or one and the same substrate 2. Furthermore, the waveguide is made as described above, so that its operating temperature is substantially the same as that of the laser. In this case, one and the same Peltier effect device is planned for the laser and the waveguide. A polarizer 4 is placed on top of the output 11 of the isolator waveguide 1. The plane of the emitting part of the laser makes an angle of 45 degrees with the isolator waveguide 1 plane so as to work as described above.

It is quite clear that the above description has been given purely as a non-restrictive example, and that other alternatives could be considered without going beyond the scope of the invention. The digital examples, in particular, the examples of compositions, and the position of the heating device 3 with respect to the guide have been given purely to illustrate the invention.

We claim:

1. Integrated, single-mode isolator waveguide comprising:
   a substrate, a guide layer (1), implanted in the substrate, the guide layer having an input and an output, a polarizing device (4) placed at one end (11) of the guide layer and oriented so as to eliminate a polarization mode of an entering beam from the output, and at least one heating means (3) associated with the guide layer.

2. Integrated, single-mode isolator waveguide comprising:

a substrate;

a guide layer (1) implanted on the substrate (2), the guide layer having a refractive index greater than that of the substrate, and an input and an output, a polarizing device (4) placed at one end (11) of the guide layer and oriented so as to eliminate a mode of polarization of an entering beam entering into the guide layer from the output, and an intermediate guide layer (5) located between the guide layer (1) and the substrate (2) and having a guiding index very slightly smaller than that of the guide layer, so as to ensure single-mode operation and having a thickness for coupling to a single-mode fiber core.

3. Isolator waveguide according to claim 2, further comprising a heating means (3) associated with the guide layer.

4. Isolator waveguide according to one of claims 1 or 3, wherein the heating means (3) is a Peltier effect device.

5. Isolator waveguide according to claim 2, wherein the guide layer (1) and the intermediate layer (5) are made of gallium-doped yttrium-iron-garnet, a doping of the guide layer (1) being slightly lower than that of the intermediate layer (5).

6. A semiconductor laser and an integrated, single-mode isolator waveguide wherein:

the isolator waveguide comprises:

a substrate;

a guide layer (1), implanted in the substrate, the guide layer having an input and an output, a polarizing device (4) placed at one end (11) of the guide layer and oriented so as to eliminate a polarization mode of an entering beam from the output, and at least one heating means (3) associated with the guide layer;

the substrate is common to both the semiconductor laser and the isolator waveguide; and the at least one heating means is common to both the semiconductor laser and the isolator waveguide.

7. A semiconductor laser and an integrated, single-mode isolator waveguide wherein:

the isolator wave guide comprising:

a substrate, a guide layer (1) implanted on the substrate (2), the guide layer having a refractive index greater than that of the substrate, and an input and an output, a polarizing device (4) placed at one end (11) of the guide layer and oriented so as to eliminate a mode of polarization of an entering beam entering into the guide from the output, and an intermediate guide layer (5) located between the guide layer (1) and the substrate (2) and having a guiding index very slightly smaller than that of the guide layer, so as to ensure single-mode operation and having a thickness for coupling to a single-mode fiber core;

the substrate is common to both the semiconductor laser and the isolator waveguide; and at least one heating means is common to both the semiconductor laser and the isolator waveguide.

8. Semiconductor laser and isolator associated according to claims 6 or 7, wherein the heating device (3) is a Peltier effect device, thermally coupled to the substrate (2).

9. Isolator waveguide according to claim 7, wherein the at least one heating means (3) is associated with the guide layer.

10. Isolator waveguide according to one of claims 7 or 9, wherein the heating means (3) is a Peltier effect device.

11. Isolator waveguide according to claim 7, wherein the guide layer (1) and the intermediate layer (5) are made of gallium-doped yttrium-iron-garnet, a doping of the guide layer (1) being slightly lower than that of the intermediate layer (5).

* * * * *